United States Patent
Yokota et al.

(10) Patent No.: US 8,325,471 B2
(45) Date of Patent: Dec. 4, 2012

(54) DISPLAY DEVICE

(75) Inventors: Yasuo Yokota, Osaka (JP); Kiyotaka Nakase, Osaka (JP); Keizo Kawakami, Hyogo (JP)

(73) Assignee: Panasonic Corporation, Osaka (JP)

( * ) Notice: Subject to any disclaimer, the term of this patent is extended or adjusted under 35 U.S.C. 154(b) by 342 days.

(21) Appl. No.: 12/741,770

(22) PCT Filed: Oct. 24, 2008

(86) PCT No.: PCT/JP2008/003038
§ 371 (c)(1),
(2), (4) Date: May 6, 2010

(87) PCT Pub. No.: WO2009/063594
PCT Pub. Date: May 22, 2009

(65) Prior Publication Data
US 2010/0246111 A1    Sep. 30, 2010

(30) Foreign Application Priority Data
Nov. 15, 2007   (JP) .................................. 2007-296514

(51) Int. Cl.
*G06F 1/16* (2006.01)

(52) U.S. Cl. .................. 361/679.21; 361/752; 361/760; 345/60; 312/223.1; 312/223.2

(58) Field of Classification Search .............. 361/679.21
See application file for complete search history.

(56) References Cited

U.S. PATENT DOCUMENTS

| | | | | |
|---|---|---|---|---|
| 6,494,429 B2* | 12/2002 | Tajima | .......................... | 248/473 |
| 7,164,586 B2* | 1/2007 | Lin | ............................... | 361/714 |
| 7,259,958 B2* | 8/2007 | Bang et al. | ............... | 361/679.27 |
| 7,394,186 B2* | 7/2008 | Kim | ................................ | 313/46 |
| 7,401,968 B2* | 7/2008 | Jung et al. | ..................... | 362/632 |
| 7,515,222 B2* | 4/2009 | Yamanaka | ...................... | 349/58 |
| 7,529,082 B2* | 5/2009 | Maruta | .......................... | 312/7.2 |
| 7,554,798 B2 | 6/2009 | Tanokuchi et al. | | |
| 7,604,390 B2* | 10/2009 | Zhang et al. | .................. | 362/634 |
| 7,656,469 B2* | 2/2010 | An | .................................. | 349/58 |
| 7,796,206 B2* | 9/2010 | Hiradate et al. | ............... | 349/58 |
| 8,093,811 B2* | 1/2012 | Tanokuchi et al. | ........... | 313/582 |
| 2002/0185940 A1* | 12/2002 | An | ................................. | 312/7.2 |
| 2003/0234895 A1* | 12/2003 | Sugawara et al. | .............. | 349/58 |
| 2004/0027073 A1* | 2/2004 | Nomoto et al. | ............... | 313/583 |

(Continued)

FOREIGN PATENT DOCUMENTS

| | | |
|---|---|---|
| JP | 11-119678 A | 4/1999 |
| JP | 2001-236022 A | 8/2001 |
| JP | 2002-108225 A | 4/2002 |
| JP | 2003-131580 A | 5/2003 |
| JP | 2002-099218 A | 4/2005 |

(Continued)

*Primary Examiner* — Anthony Q Edwards
(74) *Attorney, Agent, or Firm* — Hamre, Schumann, Mueller & Larson, P.C.

(57) ABSTRACT

The present invention provides a display device that prevents damage on a display panel even when the display device drops or falls down during handling. The display device includes: a PDP (10) including a front panel (20) and a back panel (30) that have peripheral portions joined to each other by a sealing material (36); a chassis member (44) supporting the PDP (10); and a housing enclosing the PDP (10) and the chassis member (44). The housing includes a front housing portion (41) provided with an opening (54), a side housing portion (51), and a back housing portion (42). The back housing portion (42) is provided with a drawn portion (62), and a top part of the drawn portion (62) is coupled to the chassis member (44) by a fixing member.

7 Claims, 9 Drawing Sheets

U.S. PATENT DOCUMENTS

| | | | |
|---|---|---|---|
| 2005/0212426 A1* | 9/2005 | Ahn .............................. | 313/582 |
| 2005/0243106 A1* | 11/2005 | Bae et al. ...................... | 345/679 |
| 2006/0098415 A1* | 5/2006 | Kim et al. ..................... | 361/740 |
| 2007/0041149 A1* | 2/2007 | Homer et al. ................. | 361/681 |

FOREIGN PATENT DOCUMENTS

| | | |
|---|---|---|
| JP | 2005-292310 A | 10/2005 |
| JP | 2007-033566 A | 2/2007 |
| JP | 2007-293188 A | 11/2007 |

* cited by examiner

DISPLAY DEVICE

TECHNICAL FIELD

The present invention relates to a display device having a structure for preventing cracks in and breakage of a glass substrate included therein when the display device drops or falls down.

BACKGROUND ART

In recent years, liquid crystal display devices using a liquid crystal display panel and plasma display devices using a plasma display panel (hereinafter simply referred to as a PDP) have been gaining attention as display devices suitable for achieving a reduction in thickness and an increase in size. These display devices have been produced in large quantities and sales thereof also have been increasing rapidly.

The PDP is composed of a pair of panels, a front panel and a back panel, each having a glass substrate. The front panel includes a front glass substrate on which a display electrode pair, a dielectric layer, a protective layer, etc. are formed. On the other hand, the back panel includes a back glass substrate on which a data electrode, a barrier rib, a phosphor layer, etc. are formed. The front panel and the back panel are disposed facing each other so that a minute discharge space is formed therebetween. A gap between a peripheral portion of the front panel and a peripheral portion of the back panel is sealed with a sealing material. The discharge space is filled with a discharge gas containing neon (Ne), xenon (Xe), etc.

A chassis member is attached to a back surface of the back panel of the PDP via a joining member such as an adhesive heat-conducting sheet and an adhesive agent, etc. A peripheral portion of the chassis member is fixed to a mounting metal piece with screws. The chassis member is a substrate for supporting and fixing the PDP and attaching thereto circuit boards on which a drive circuit for driving the PDP is formed. The chassis member also has a function of radiating effectively the heat generated by the PDP. Furthermore, the plasma display device includes a front frame and a back cover for protecting the PDP and the circuit boards. On a front side of the PDP, a front protective glass substrate is disposed spaced apart from a surface of the front panel of the PDP. The front protective glass substrate is attached to a front housing portion having an opening corresponding to an effective display region of the front panel of the PDP. The front protective glass substrate has functions of color tone correction, contrast improvement, and electromagnetic wave blocking.

In contrast to the back panel fixed by the chassis member, the front panel merely is fixed, at the peripheral portion thereof, only by a sealed portion composed of the sealing material. Therefore, when the plasma display device drops forward (with the front protective glass substrate facing down) during transportation or unpacking, the front panel is warped in the shape of a bowl taking the sealed portion as the supporting point, and has cracks and fractures. More specifically, although the back panel is warped merely in accordance with the warpage of the chassis member, the front panel is warped further from the state of being warped by the warpage of the chassis member. Since the warpage of the chassis member is superimposed on the warpage of the front panel in this way, the front panel tends to be damaged easily.

In order to prevent the cracks in and breakage of the front panel, it can be considered to dispose a frame-shaped elastic member in a gap between the surface of the front panel and the front protective glass substrate along a peripheral portion of the effective display region, as disclosed in JP 2003-131580 A, for example. Such a configuration can suppress to some extent the warpage of the front panel that is a cause of the damage to the front panel.

However, considering the fact that the warpage of the chassis member is superimposed on the warpage of the front panel as described above, it is desired to suppress the warpage of the chassis member rather than to suppress the warpage of the front panel directly, in order to prevent damage to the front panel.

JP 2007-33566 A and JP 2002-108225 A each disclose an example in which a measure is taken against the impact to a PDP. Specifically, JP 2007-33566 A discloses an example in which a plurality of spring structures are provided on a chassis member bonded to a PDP by a joining member, and the spring structures are coupled to a back housing portion by a coupling member (spacer). JP 2002-108225 A discloses an example in which a pole penetrating through a back housing portion stands on a chassis member, the pole is supported by an elastic member provided on the back housing portion, and a spring member is disposed between the back housing portion and a stopper provided at a tip of the pole. However, these examples are intended to absorb the impact transmitted from the back housing portion to the PDP by using the spring structures and the spring member, and are not intended to suppress the warpage of the chassis member.

DISCLOSURE OF INVENTION

The present invention is intended to resolve the above-mentioned problem and provide a display device capable of enhancing the impact resistance of a PDP against the forward dropping.

In order to solve the above-mentioned problem, the present invention provides a display device including: a display panel including a front panel and a back panel that have peripheral portions joined to each other by a sealing material; a chassis member joined to the back panel of the display panel by a joining member; and a housing enclosing the display panel and the chassis member. The housing includes a front housing portion provided with an opening corresponding to an effective display region of the front panel, a side housing portion coupled to the front housing portion, and a back housing portion that is coupled to the side housing portion and covers a back surface of the chassis member. The back housing portion is provided with a drawn portion projecting toward the opening or away from the opening, and a top part of the drawn portion is coupled to the chassis member by a fixing member.

In such a configuration, since the drawn portion is formed on the back housing portion, the back housing portion has a high rigidity. The chassis member is coupled to the high-rigidity back housing portion by the fixing member. Therefore, when the display device drops forward (with the display direction of the display panel oriented downward), it is possible to suppress the warpage of the chassis member to reduce the warpage of the display panel, and prevent the damage to the display panel.

The chassis member may have a boss, and the drawn portion of the back housing portion may be coupled to the boss of the chassis member by the fixing member. Such a configuration makes it possible to couple firmly the chassis member to the drawn portion and increase its reliability.

The back housing portion may be composed of a metal plate, and the drawn portion may be formed by performing a drawing process on the metal plate. Such a configuration makes it possible to form the drawn portion while reducing the weight of the back housing portion.

The drawn portion preferably is a linear projection extending across the back housing portion. With such a configuration, the drawn portion serves as a rib, and thereby the rigidity of the back housing portion is increased significantly.

Furthermore, it is desirable that a plurality of the drawn portions are provided in a pattern of stripes repeated in a direction of a plane defined by the display panel. Such a configuration makes it possible to form the drawn portions easily by performing a bending process or a drawing process on the metal plate composing the back housing portion.

Furthermore, the drawn portions preferably are arranged in at least one of a longer direction of the display panel, a shorter direction of the display panel, and a direction intersecting the longer direction and the shorter direction. Such a configuration makes it possible to provide a relatively large number of the drawn portions.

Furthermore, it is desirable that the drawn portions be arranged between a pair of sides of the back housing portion facing each other so that the drawn portions are parallel with these sides, from the vicinity of one of the sides to the vicinity of the other side. Such a configuration makes it possible to reinforce the back housing portion entirely and increase the rigidity of the back housing portion.

Furthermore, it is desirable that at least one of the drawn portions be coupled to the chassis member by the fixing member. Such a configuration makes it possible to fix the back housing portion with an entirely increased rigidity to the chassis member, and reduce the warpage of the display panel.

According to the present invention, even when a display device including a display panel, such as a PDP, drops forward, the breakage of the display panel can be suppressed. Thus, the present invention can provide a display device having an enhanced impact resistance.

BEST MODE FOR CARRYING OUT THE INVENTION

Hereinafter, embodiments of the present invention will be described with reference to the drawings. In the embodiments of the invention, a plasma display device will be described as a display device and a PDP will be described as a display panel.

(Embodiment 1)

Figure 1:
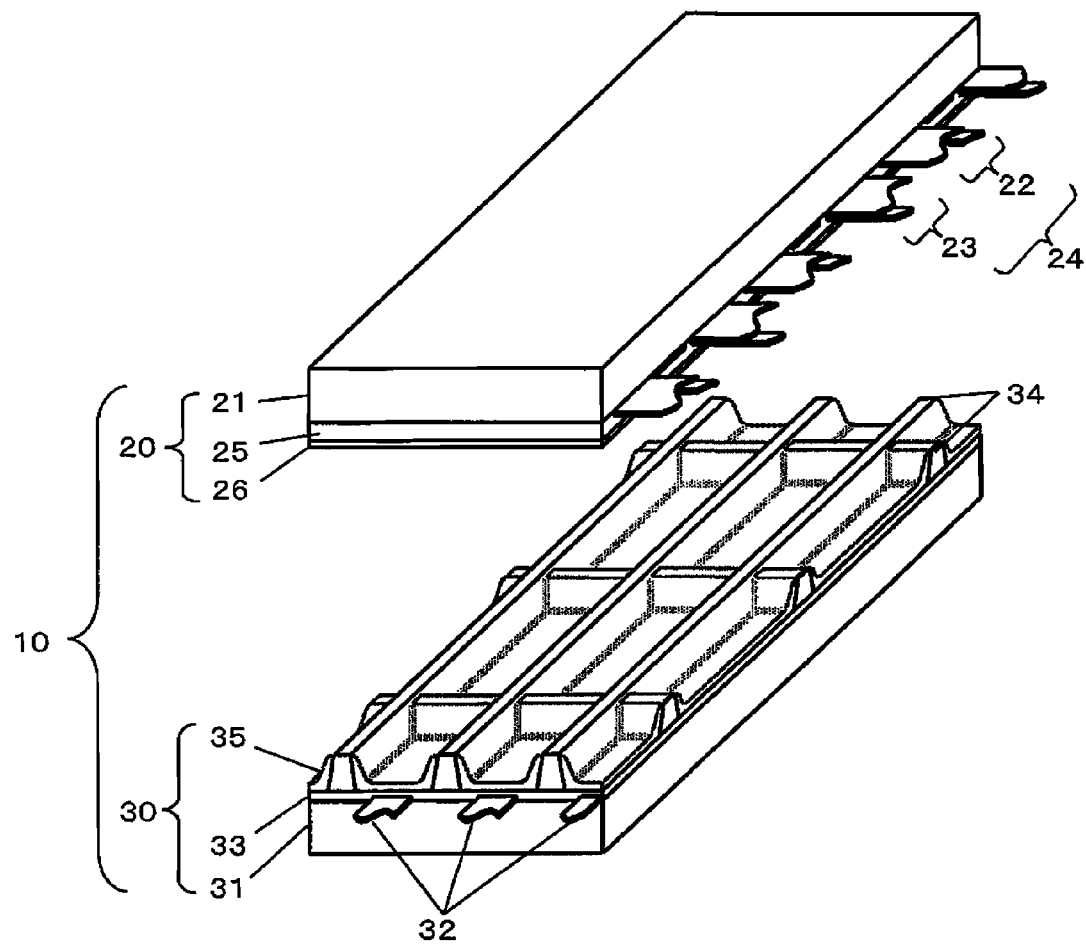
FIG. 1 is an exploded perspective view of a main part showing a basic configuration of a PDP used for a plasma display device as a display device.
Figure 2:
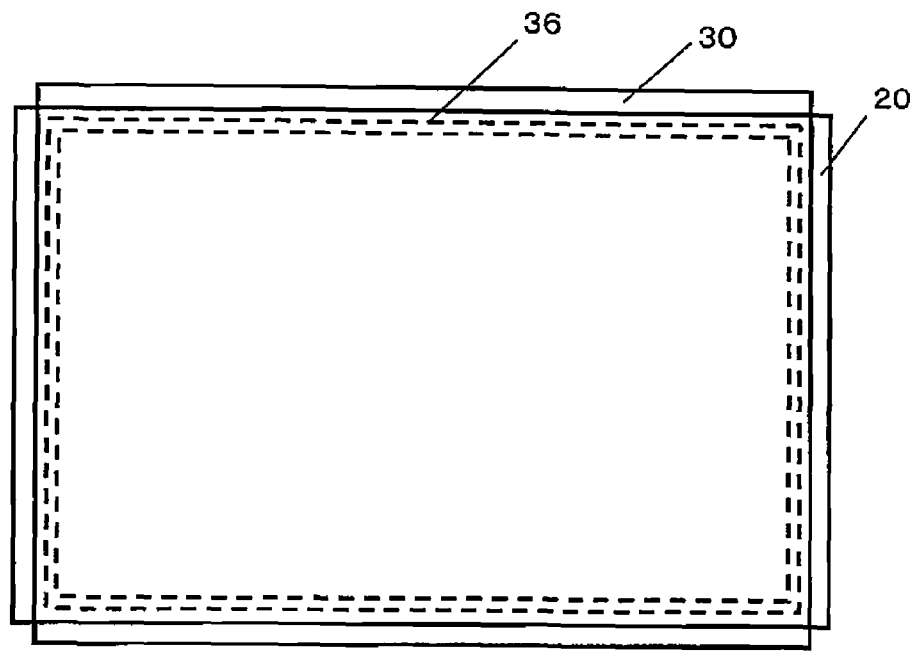
FIG. 2 is a plan view of the PDP.

FIG. 1 is an exploded perspective view of a main part showing a basic configuration of a PDP used for a plasma display device as a display device. FIG. 2 is a plan view of the PDP. A PDP 10 is composed of a front panel 20 and a back panel 30. The front panel 20 has a front glass substrate 21 on which a plurality of display electrode pairs 24 are formed. The display electrode pair 24 is composed of a scanning electrode 22 and a sustaining electrode 23 arranged in parallel with each other. A dielectric layer 25 is formed so as to cover the scanning electrode 22 and the sustaining electrode 23. A protective layer 26 is formed on the dielectric layer 25.

The back panel 30 has a back glass substrate 31 on which a plurality of data electrodes 32 are arranged in parallel with each other. A base dielectric layer 33 is formed so as to cover the data electrodes 32, and grid-like barrier ribs 34 further are formed thereon. Phosphor layers 35 that emit red, green, or blue light are formed in order for each of the data electrodes 32, respectively, on side surfaces of the barrier ribs 34 and on the base dielectric layer 33.

As shown in FIG. 2, the front panel 20 and the back panel 30 are disposed facing each other with a minute discharge space therebetween so that the display electrode pairs 24 intersect with the data electrodes 32. Peripheral portions of the front panel 20 and the back panel 30 are joined to each other by a sealing material 36, such as glass frit, so as to seal a gap between the peripheral portions. The discharge space is filled with a mixed gas of neon (Ne) and xenon (Xe), for example, as a discharge gas. The barrier ribs 34 partition the discharge space into a plurality of sections. A discharge cell is formed at each of intersections between the display electrode pairs 24 and the data electrodes 32. Discharge is caused in the discharge cells. Ultraviolet rays generated by the discharge excite the phosphor layer 35 and light is emitted to display color images. The structure of the PDP 10 is not limited to the structure mentioned above. For example, the PDP 10 may include stripe-like barrier ribs.

Figure 3:
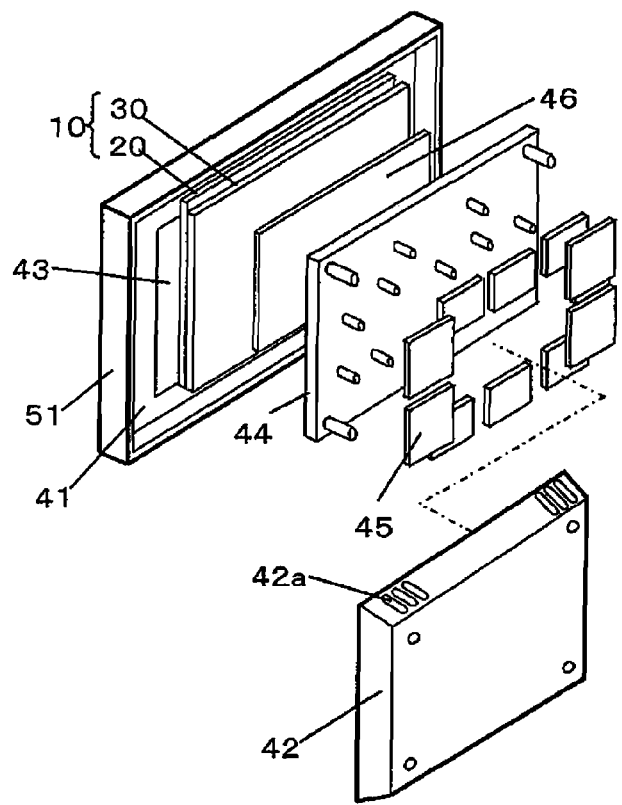
FIG. 3 is an exploded perspective view showing a main configuration of the plasma display device.

FIG. 3 is an exploded perspective view showing a main configuration of the plasma display device. A plasma display device 40 includes a housing accommodating the PDP 10 and a chassis member 44 to be described later. The housing is composed of a front housing portion 41, a side housing portion 51, and a back housing portion 42. The front housing portion 41 is in the shape of a rectangular plate disposed in front of the PDP 10. The side housing portion 51 has a rectangular cylindrical shape surrounding the PDP 10 from a direction perpendicular to its thickness direction. A front end portion of the side housing portion 51 is coupled to an outer peripheral portion of the front housing portion 41. The back housing portion 42 is a so-called back cover that is coupled to a back end portion of the side housing portion 51 and covers a back surface of the chassis member 44 to be described later. In the present embodiment, the front housing portion 41 and the side housing portion 51 compose a front frame.

The front housing portion 41 is provided with an opening corresponding to an effective display region of the front panel 20. A front protective glass substrate 43 including a glass substrate, for example, is disposed at the opening. The back panel 30 of the PDP 10 is joined to the chassis member 44 via a joining member 46. The chassis member 44 is composed of a metal plate made of aluminum (Al) or the like, and serves as a heat-radiating plate. The joining member 46 is made of an adhesive material or a fusion material. The joining member 46 allows the back glass substrate 31 of the PDP 10 to be joined to the chassis member 44 almost entirely, and transfers the heat generated by the PDP 10 to the chassis member 44. Circuit boards 45 constructing a circuit block for driving the PDP 10 are fixed to the chassis member 44.

The front protective glass substrate 43 serves a role of an optical filter as well as a role of protecting the PDP 10. Silver (Ag) vapor deposition, for example, is applied to the front protective glass substrate 43 in order to suppress unnecessary radiation of electromagnetic waves. The back housing portion 42 is provided with a plurality of ventilation holes 42a for releasing the heat generated by the PDP 10 and the circuit boards 45 to the outside. The circuit boards 45 are attached to a back surface side of the chassis member 44 and construct an electric circuit to drive the PDP 10 and control the driving. The circuit boards 45 are connected electrically to an extraction electrode part (not shown) extracted at an edge of the PDP 10, by a plurality of flexible wiring boards (not shown).

Figure 4A:
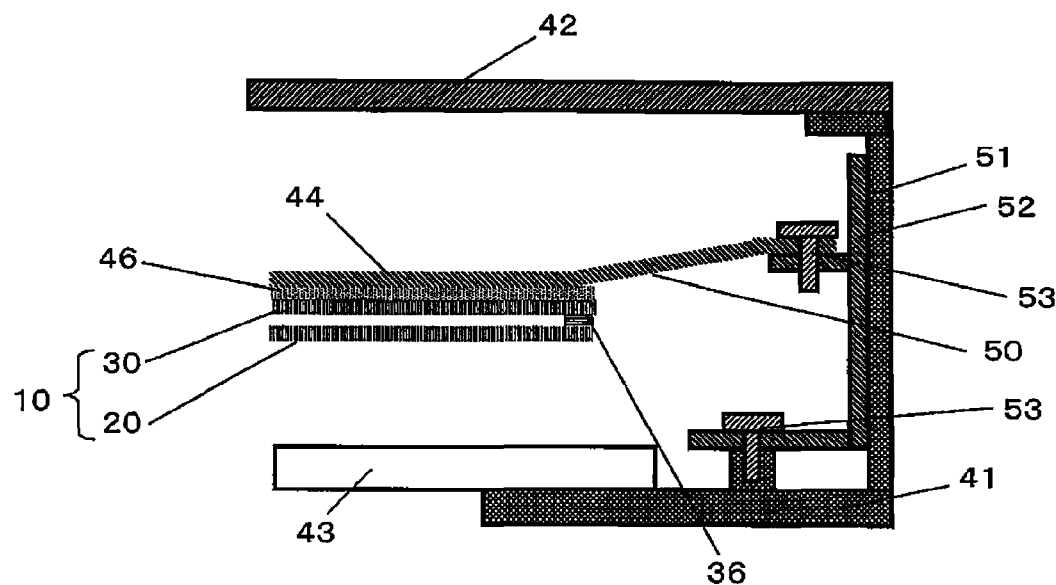
FIGS. 4A and 4B each are a partial cross-sectional view showing a structure of the plasma display device.
Figure 4B:
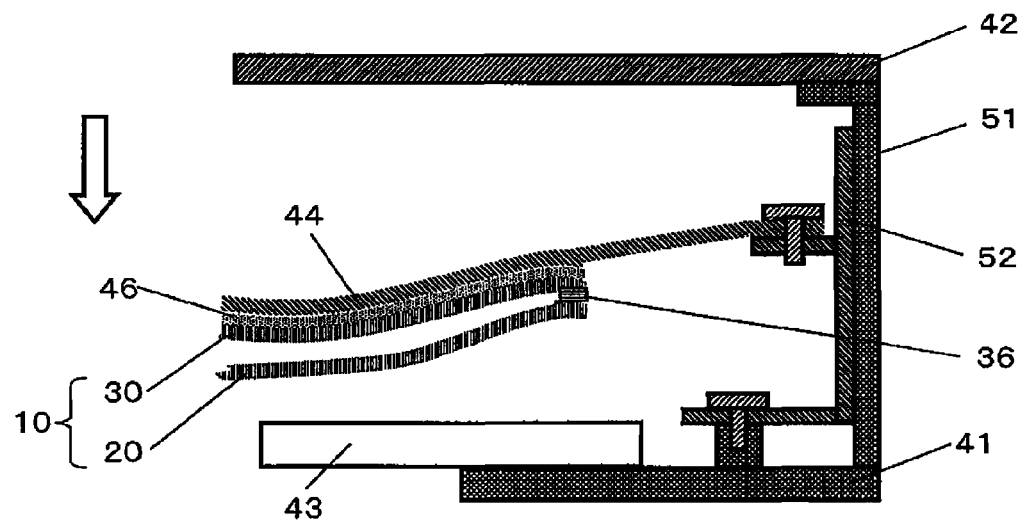

FIG. 4A and FIG. 4B each are a partial cross-sectional view showing a structure of the plasma display device. FIG. 4A is a cross-sectional view showing a structure of the plasma display device 40 in a stationary state. FIG. 4B is a cross-sectional view showing the plasma display device 40 when dropping with the PDP 10 side facing down.

As shown in FIG. 4A, the back panel 30 of the PDP 10, which has the peripheral portion joined to the front panel 20 by sealing using the sealing material 36, is fixed to the chassis member 44 by adhesion using the joining member 46 such as an adhesive sheet. The chassis member 44 has a mounting metal piece 50 that is an extended part thereof. The mounting metal piece 50 is fixed to a mounting member 52 provided on the side housing portion 51 that is a part of the housing with screws 53. The mounting member 52 is fixed also to the front housing portion 41 with screws 53. The front panel 20 and the front protective glass substrate 43 are spaced apart from each other keeping a specified distance therebetween.

When the plasma display device thus configured drops in a direction indicated by the arrow shown in FIG. 4B, that is, in a direction of the front panel 20, during transportation or unpacking, the PDP 10 is warped into the shape of a bowl while the warpage of the chassis member 44 is superimposed thereon. However, since the front panel 20 is fixed to the back panel 30 by the sealing material 36 only at the peripheral portion, a central region of the front panel 20 is warped significantly taking the sealing material 36 as the supporting point. Accordingly, stress is applied to a region where the sealing material 36 is present, causing cracks in the sealing material 36 and fractures in the glass substrate in this region. As a result, the PDP 10 is broken by receiving such an impact of the forward dropping.

Figure 5:
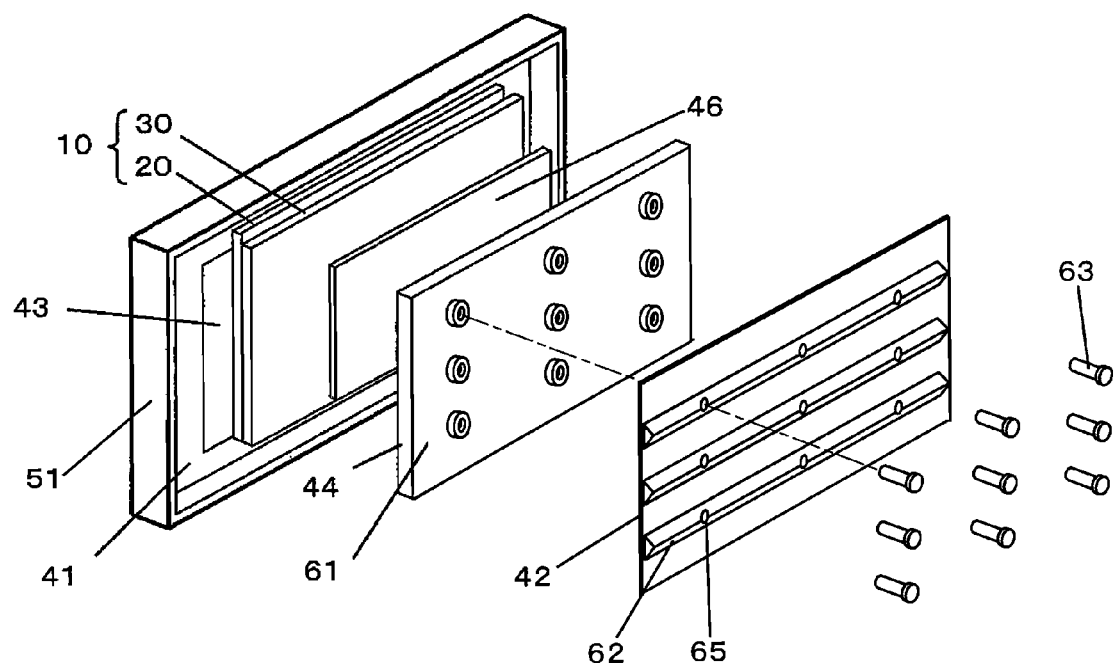
FIG. 5 is an exploded perspective view showing a main configuration of a plasma display device that is a display device according to Embodiment 1 of the present invention.

FIG. 5 is an exploded perspective view showing a main configuration of a plasma display device that is a display device according to Embodiment 1 of the present invention. The configuration of the plasma display device is the same as that described with reference to FIG. 3, except for the following.

The plasma display device that is the display device according to Embodiment 1 of the present invention has the back housing portion 42 with a significantly different configuration from that of the back housing portion 42 of the plasma display device shown in FIG. 3. In the plasma display device shown in FIG. 5, the circuit boards that are fixed to the chassis member 44 and construct the circuit block for driving the PDP 10 are not shown.

More specifically, as shown in FIG. 5, the back housing portion 42 is provided with drawn portions 62 for increasing the rigidity of the back housing portion 42. Furthermore, through holes 65 are formed at a top part of each of the drawn portions 62, and bosses 61 are formed on the chassis member 44 at positions corresponding to the through holes 65. Via the through holes 65, screws 63 serving as fixing members each are screwed into a tapped hole formed at a center of each of the bosses 61, so that the top parts of the drawn portions 62 are coupled to the bosses 61 formed on the chassis member 44 with screws 63.

Figure 6:
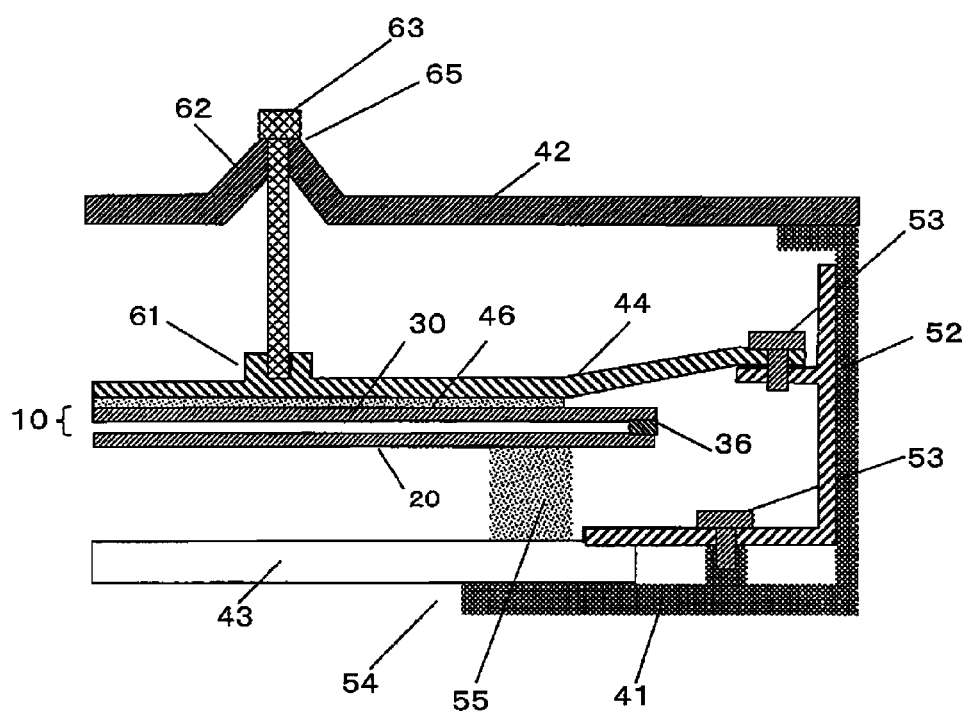
FIG. 6 is a partial cross-sectional view of the plasma display device shown in FIG. 5.
Figure 7:
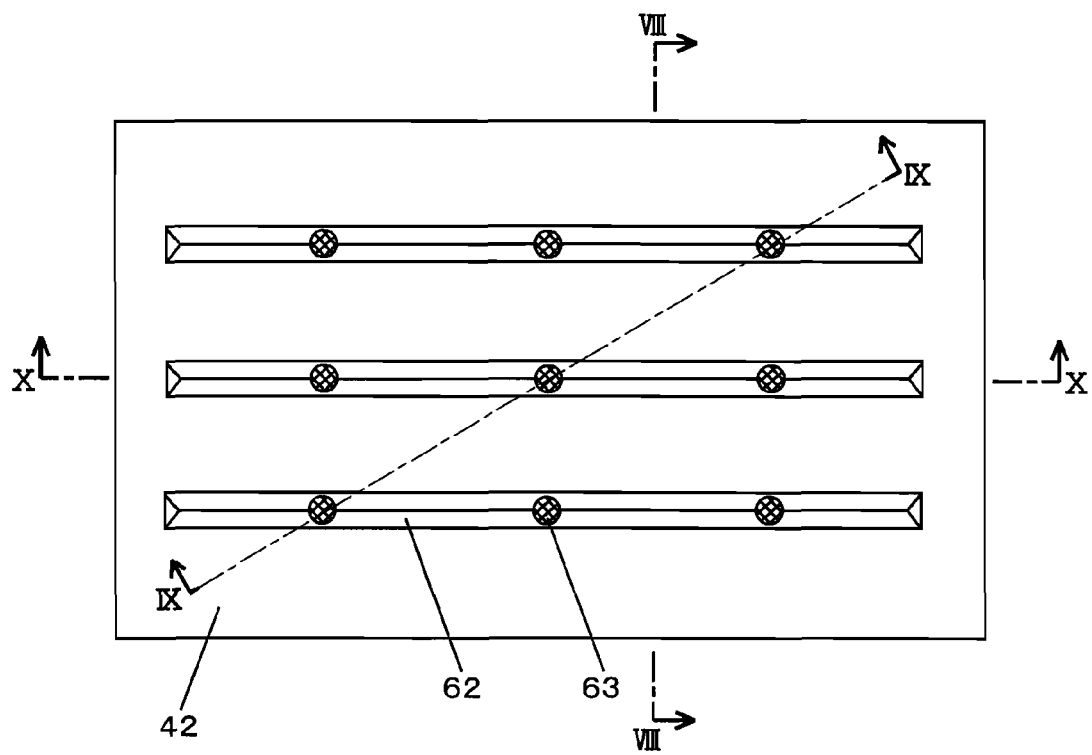
FIG. 7 is a plan view of the plasma display device shown in FIG. 5 when viewed from the back of a back housing portion thereof.
Figure 8:
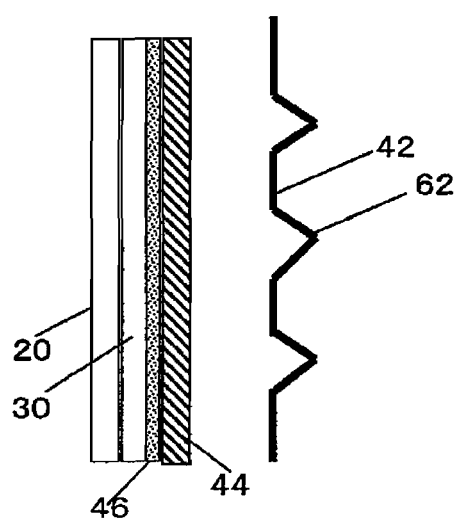
FIG. 8 is a cross-sectional view taken along the line VIII-VIII in FIG. 7.
Figure 9:
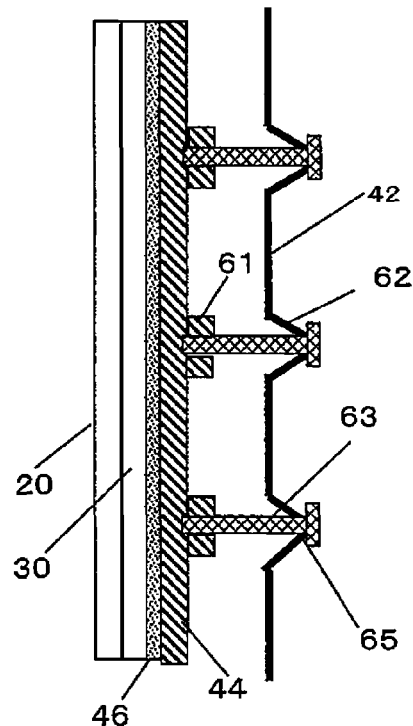
FIG. 9 is a cross-sectional view taken along the line IX-IX in FIG. 7.
Figure 10:
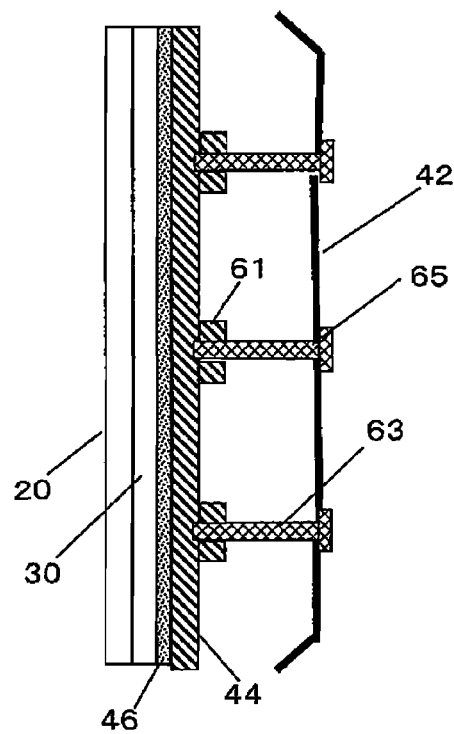
FIG. 10 is a cross-sectional view taken along the line X-X in FIG. 7.

With reference to FIG. 6 to FIG. 10, the configuration of the plasma display device that is the display device according to Embodiment 1 of the present invention will be described in detail. FIG. 6 is a partial cross-sectional view of the plasma display device that is the display device according to Embodiment 1 of the present invention. FIG. 7 is a plan view of the plasma display device when viewed from the back of a back housing portion. FIG. 8 is a cross-sectional view taken along the line VIII-VIII in FIG. 7. FIG. 9 is a cross-sectional view taken along the line IX-IX in FIG. 7. FIG. 10 is a cross-sectional view taken along the line X-X in FIG. 7.

As shown in FIG. 6, the plasma display device 40 is composed of the PDP 10 including the front panel 20, the back panel 30, and the sealing member 36 sealing the gap between the peripheral portions of these panels; the chassis member 44 joined to the back panel 30 by the joining member 46; and the housing. As described with reference to FIG. 3, the housing is composed of the front housing portion 41 having, at a center thereof, an opening 54 for viewing the PDP 10; the side housing portion 51 coupled to the outer peripheral portion of the front housing portion 41; and the back housing portion 42. The front housing portion 41 is provided with the front protective glass substrate 43 for protecting the PDP 10, and a dust-proofing member 55 disposed between the front protective glass substrate 43 and the PDP 10.

The chassis member 44 has the mounting metal piece 50 that is an extended part thereof. The mounting metal piece 50 is fixed to one end portion of the mounting member 52 with screws 53. Another end portion of the mounting member 52 is fixed to the front housing portion 41 with screws 53. The front panel 20 and the front protective glass substrate 43 are spaced apart from each other keeping a specified distance therebetween.

The back housing portion 42 is provided with the drawn portions 62 projecting away from the opening 54. Preferably, the drawn portions each are a linear projection extending across the back housing portion 42. Each of the drawn portions 62 of the present embodiment extends with a constant cross section in the form of a straight line bent at its center. The top part of the drawn portion 62 is sharp. Here, the phrase "extend across the back housing portion 42" means that the drawn portion 62 has a length of 60% or more of that of the back housing portion 42 in a longitudinal direction of the drawn portion 62. In the present embodiment, the drawn portions 62 each have a length of approximately 90% of that of the back housing portion 42 in the longitudinal direction of the drawn portion 62. Moreover, in the present embodiment, a plurality of the through holes 65 (three in the example illustrated) are provided at the top part of each of the drawn portions 62 along a longitudinal direction of the drawn portion 62. On the other hand, on a back surface of the chassis member 44 facing the back housing portion 42, the bosses 61 are provided corresponding to the positions of the through holes 65. Via the through holes 65 formed in the back housing portion 42, the bosses 61 provided on the chassis member 44 are coupled to the back housing portion 42 with the screws 63 serving as fixing members.

As shown in FIG. 7, the drawn portions 62 of the present embodiment extend in parallel with a longer direction of the PDP 10 and are arranged in three rows in a shorter direction of the PDP 10. More specifically, the drawn portions 62 are provided in a pattern of stripes repeated in the shorter direction of the PDP 10. Such a configuration makes it possible to form the metal plate composing the back housing portion 42 easily by performing a drawing process, and increase the rigidity of a big screen particularly in its longer direction. The direction in which the drawn portions 62 are arranged does not need to be the longer direction of the PDP 10. It may be the shorter direction of the PDP 10, or an oblique direction intersecting the longer direction and the shorter direction of the PDP 10. That is, the direction in which the drawn portions 62 are arranged is not limited as long as the drawn portions 62 are provided in a pattern of stripes repeated in a direction of a plane defined by the PDP 10. However, the drawn portions 62 preferably are arranged between a pair of sides of the back housing portion facing each other so that the drawn portions are parallel with these sides, from the vicinity of one of the sides to the vicinity of the other side. Or the drawn portions 62 may be arranged in a plurality of directions. That is, the drawn portions 62 may be arranged in at least one of the longer direction, the shorter direction, and the oblique direction of the PDP 10.

As shown in FIG. 8, FIG. 9, and FIG. 10, the through holes 65 are formed at the top part of each of the drawn portions 62 and the bosses 61 are formed on the chassis member 44 at positions corresponding to the through holes 65 so that the back housing portion 42 and the chassis member 44 are fixed to each other with the screws 63.

The back housing portion 42 is formed of a thin metal plate. The drawn portions 62 of the back housing portion 42 can be formed by performing a bending process or a drawing process on this thin metal plate. The drawn portions 62 thus formed may have a wave shape or an angular shape. The number of the drawn portions 62 and the height and width of the projections can be determined based on the thickness and material of the thin metal plate composing the back housing portion 42, and further based on the screen size of the PDP 10.

This embodiment of the present invention makes it possible to increase the rigidity of the back housing portion 42 by forming the drawn portions 62 on the back housing portion 42. The back housing portion 42 with an increased rigidity is coupled to the chassis member 44 with the screws 63 serving as fixing members, so that the back housing portion 42 and the PDP 10 are integrated into a rigid body.

Thus, even when the plasma display device drops, the back housing portion 42 is not warped. Moreover, since the chassis member 44 is integrated with the back housing portion 42, the chassis member 44 does not generate warpage of such a degree that warps the PDP 10 into the shape of a bowl. Accordingly, the warpage of the chassis member 44 is suppressed, and thereby the warpage of the front panel 20 also can be suppressed. Thus, it is possible to suppress cracks from occurring in the vicinity of the sealing member 36, and damage, such as fractures, from occurring to the front panel 20.

As a result, the impact resistance and reliability of the plasma display device can be increased by reducing the warpage of the PDP 10 generated from the impact caused by the dropping of the plasma display device.

Figure 11:
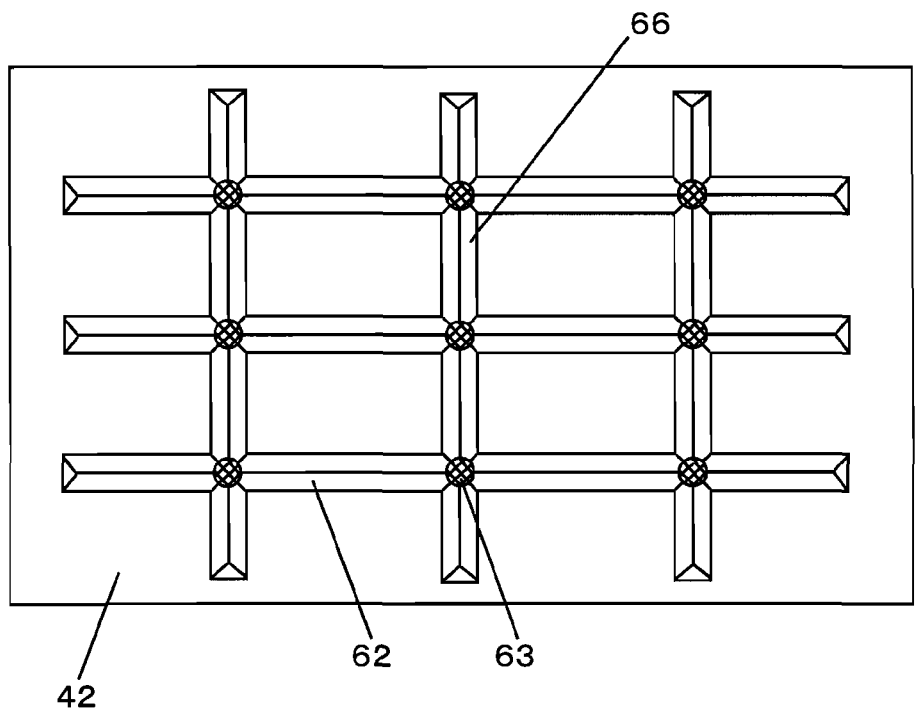
FIG. 11 is a plan view of the display device according to Embodiment 1 of the present invention when viewed from the back of the back housing portion thereof, showing a modified example of the arrangement of drawn portions provided on the back housing portion.
Figure 12:
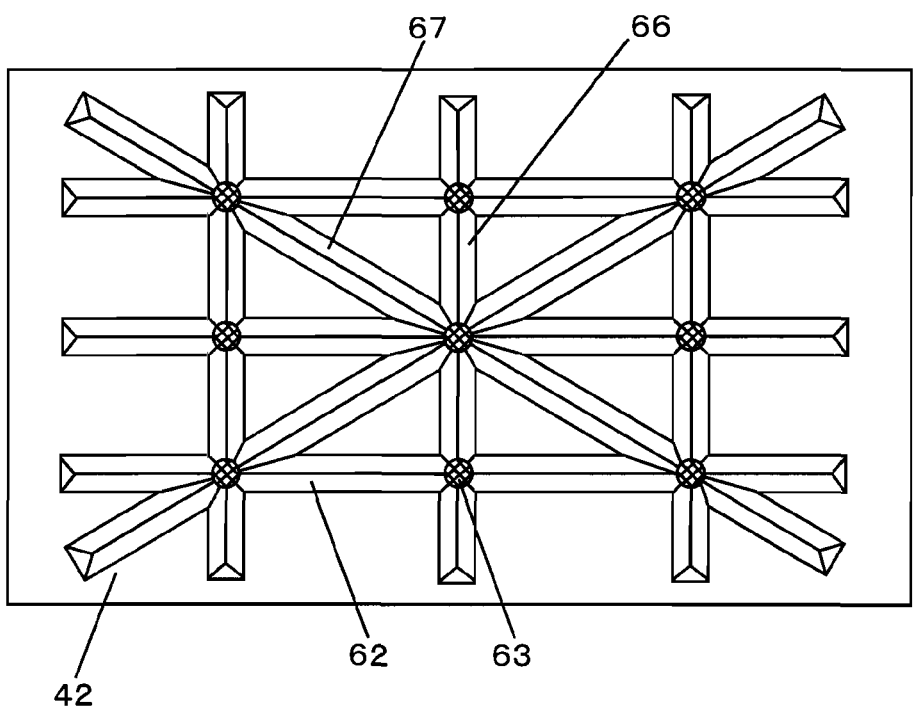
FIG. 12 is a plan view of the display device according to Embodiment 1 of the present invention when viewed from the back of the back housing portion thereof, showing a modified example of the arrangement of the drawn portions provided on the back housing portion.

FIG. 11 and FIG. 12 each are a plan view of the display device according to Embodiment 1 of the present invention when viewed from the back of the back housing portion thereof, showing a modified example of the arrangement of the drawn portions provided on the back housing portion. FIG. 11 shows an example in which drawn portions 66 extending in the shorter direction of the PDP are arranged in the longer direction of the PDP, in addition to the drawn portions 62 that are arranged in the shorter direction of the PDP and extend in the longer direction of the PDP as shown in FIG. 7. Providing the drawn portions 62 and 66 in a grid pattern can increase further the rigidity of the back housing portion 42.

FIG. 12 shows an example in which, besides the drawn portions 62 and 66 shown in FIG. 11, drawn portions 67 also are added in diagonal directions of the PDP 10. Such a configuration can increase further the rigidity of the back housing portion 42 and reduce further the warpage of the PDP 10 when the plasma display device drops.

The drawn portions do not need to be plural. Even a single drawn portion can increase the rigidity of the back housing portion 42.

(Embodiment 2)

Figure 13:
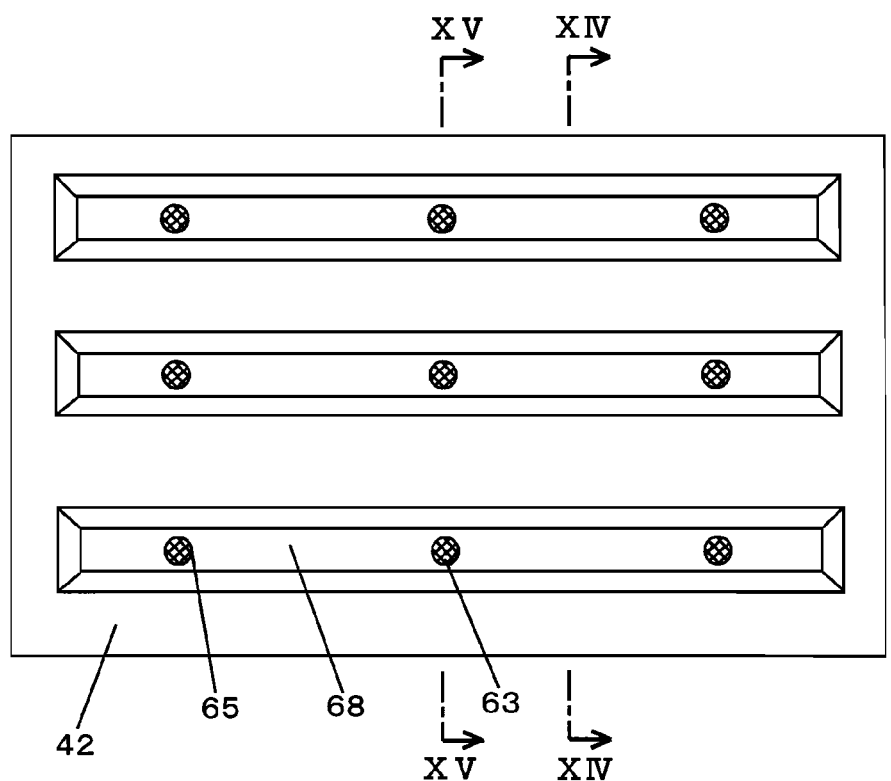
FIG. 13 is a plan view of a plasma display device as a display device according to Embodiment 2 of the present invention when viewed from the back of a housing portion thereof.
Figure 14:
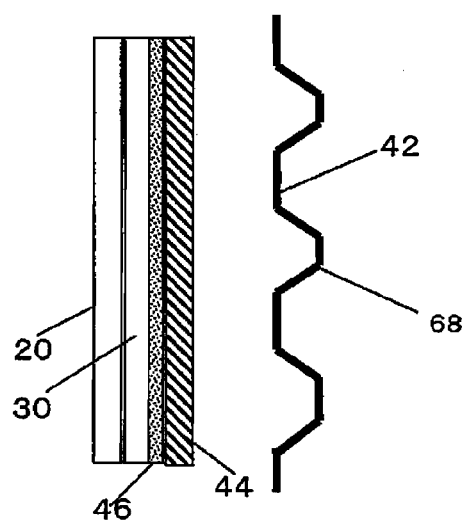
FIG. 14 is a cross-sectional view taken along the line XIV-XIV in FIG. 13.
Figure 15:
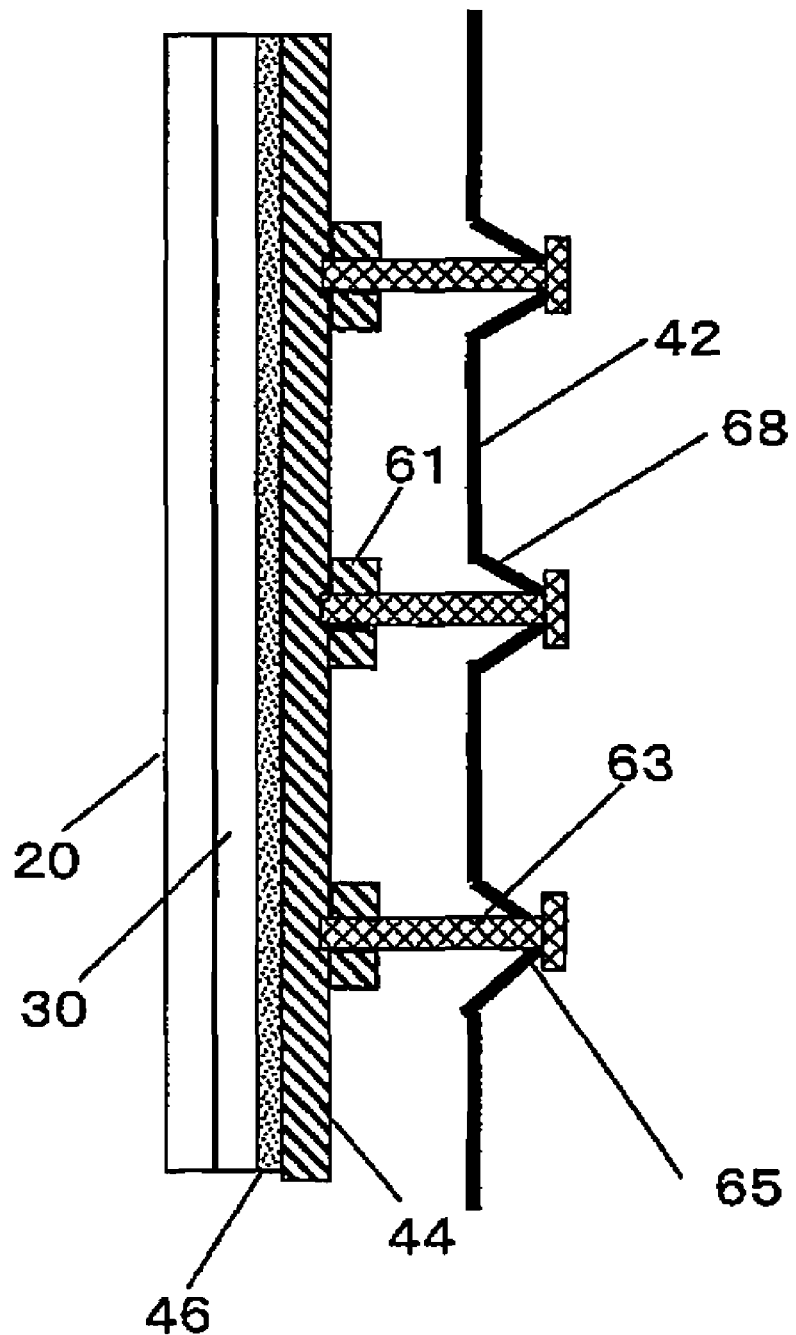
FIG. 15 is a cross-sectional view taken along the line XV-XV in FIG. 13.

FIG. 13 is a plan view of a plasma display device as a display device according to Embodiment 2 of the present invention when viewed from the back of a housing portion thereof. FIG. 14 a cross-sectional view taken along the line XIV-XIV in FIG. 13. FIG. 15 is a cross-sectional view taken along the line XV-XV in FIG. 13.

Embodiment 2 of the present invention is different from Embodiment 1 in that the drawn portions formed on the back housing portion 42 each have a trapezoidal cross-sectional shape. As shown in FIG. 13, in this embodiment of the present invention, drawn portions 68 formed on the back housing portion 42 are provided in parallel only with the longer direction of the PDP 10, and each of them has a trapezoidal cross-sectional shape. More specifically, the drawn portions 68 each have a top part that is not sharp unlike according to Embodiment 1 but flat. The PDP 10 is horizontally long because of its screen size. Thus, when dropping forward, the PDP 10 and the back housing portion 42 are warped in the longer direction significantly. Therefore, even merely providing the drawn portions 68 in parallel with the longer direction can increase the rigidity of the back housing portion 42 and reduce the warpage of the PDP 10.

As a result, in the case where the screen size of the PDP 10 is increased, in particular, it is possible to suppress the warpage s of the chassis member 44 and the PDP 10 to reduce damage, such as glass cracks, and increase the impact resistance and reliability of the plasma display device.

The cross-sectional shape of the drawn portion is not limited to the shapes described in Embodiment 1 and Embodiment 2. When the cross-sectional shape is a projecting shape having a width reducing toward the top part, the rigidity of the drawn portion can be increased further. Moreover, although the drawn portion has a shape projecting away from the opening in the embodiments of the present invention, it may have a shape projecting toward the opening. It is effective to allow sloped portions of the drawn portion to have larger thicknesses than those of other portions in a height direction of the drawn portion in order to increase the rigidity of the back housing portion. Such a drawn portion does not need to be formed by a so-called drawing process, and may be formed by bending the metal plate.

Moreover, although all of the drawn portions provided on the back housing portion are coupled to the chassis member with the screws serving as fixing members in Embodiment 1 and Embodiment 2, it also is possible to ensure a sufficient rigidity to suppress the warpage of the chassis member when at least one of the drawn portions is coupled to the chassis member with the fixing members, depending on the screen size of the display device and the rigidity of the back housing portion provided with the drawn portions.

Instead of processing the metal plate composing the back housing portion, attaching a projecting-shape member to the metal plate, or attaching a rod-shape member to the metal plate also can increase the rigidity of the back housing portion.

As the fixing members, rod-shape members that can be engaged with the chassis member and the back housing portion may be used, for example, instead of the screws.

INDUSTRIAL APPLICABILITY

As described above, the present invention can realize a display device in which a display panel is not damaged even by the impact generated when the display device drops during handling with a reduced amount of shock-absorbing packing material used. The present invention particularly is useful for display devices with a big screen.

The invention claimed is:

1. A display device comprising:
a display panel including a front panel and a back panel that have peripheral portions joined to each other by a sealing material;
a chassis member joined to the back panel of the display panel; and
a housing enclosing the display panel and the chassis member, wherein:
the housing includes a front housing portion provided with an opening corresponding to an effective display region of the front panel, a side housing portion coupled to the front housing portion, and a back housing portion that is coupled to the side housing portion and covers a back surface of the chassis member;
the back housing portion is provided with a drawn portion projecting toward the opening or away from the opening, and a top part of the drawn portion is coupled to the chassis member by a fixing member, and
the drawn portion is a linear projection extending across the back housing portion.

2. The display device according to claim 1, wherein the chassis member has a boss, and the drawn portion of the back housing portion is coupled to the boss of the chassis member by the fixing member.

3. The display device according to claim 1, wherein the back housing portion is composed of a metal plate, and the drawn portion is formed by performing a drawing process on the metal plate.

4. The display device according to claim 1, wherein a plurality of the drawn portions are provided in a pattern of stripes repeated in a direction of a plane defined by the display panel.

5. The display device according to claim 4, wherein the drawn portions are arranged between a pair of sides of the back housing portion facing each other so that the drawn portions are parallel with these sides, from the vicinity of one of the sides to the vicinity of the other side.

6. The display device according to claim 4, wherein at least one of the drawn portions is coupled to the chassis member by the fixing member.

7. The display device according to claim 1, wherein the drawn portions are arranged in at least one of a longer direction of the display panel, a shorter direction of the display panel, and a direction intersecting the longer direction and the shorter direction.

* * * * *